United States Patent
Lin et al.

(10) Patent No.: US 12,456,658 B2
(45) Date of Patent: Oct. 28, 2025

(54) KNOCKDOWN HEAT SINK STRUCTURE

(71) Applicant: ASIA VITAL COMPONENTS CO., LTD., New Taipei (TW)

(72) Inventors: Yuan-Yi Lin, New Taipei (TW); Fu-Kuei Chang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 183 days.

(21) Appl. No.: 18/196,413

(22) Filed: May 11, 2023

(65) Prior Publication Data
US 2024/0162108 A1 May 16, 2024

(30) Foreign Application Priority Data
Nov. 11, 2022 (TW) ................................. 111143220

(51) Int. Cl.
*H01L 23/367* (2006.01)
(52) U.S. Cl.
CPC ................................. *H01L 23/3672* (2013.01)
(58) Field of Classification Search
CPC . H01L 23/367; H01L 23/467; H01L 23/3672; F28D 15/02; F28D 15/0233; F28D 15/0275; F28D 2021/0028; H05K 7/20
See application file for complete search history.

(56) References Cited

U.S. PATENT DOCUMENTS 6,779,595 B1 * 8/2004 Chiang ................. H01L 23/467
165/185

FOREIGN PATENT DOCUMENTS

| CN | 2590175 Y | 12/2003 |
| CN | 1967437 A | 5/2007 |
| CN | 201238048 Y | 5/2009 |
| CN | 219248401 U | 6/2023 |
| TW | M614782 U | 7/2021 |
| TW | M632801 U | 10/2022 |

OTHER PUBLICATIONS

Search Report dated Mar. 17, 2023 issued by Taiwan Intellectual Property Office for counterpart application No. 111143220.
Search Report dated Apr. 17, 2025 issued by China National Intellectual Property Administration for counterpart application No. 2022114144065.

* cited by examiner

*Primary Examiner* — Harry E Arant
(74) *Attorney, Agent, or Firm* — Demian K. Jackson; Jackson IPG PLLC

(57) ABSTRACT

A knockdown heat sink structure includes a carrier body with a high-temperature section in contact with at least one heat source. A non-high-temperature section of the carrier body has a first radiating fin assembly, while a higher second radiating fin assembly is on the high-temperature section. The second radiating fin assembly has a first part higher than the height of the first radiating fin assembly, and a second part that outward spreads and extends from a top end of the first part and covers the first assembly without touching it, creating a spacing flow way. Therefore, the structure increases the heat dissipation area for the high-temperature section, allowing for faster heat dissipation.

4 Claims, 3 Drawing Sheets

KNOCKDOWN HEAT SINK STRUCTURE

This application claims the priority benefit of Taiwan patent application number 111143220 filed on Nov. 11, 2022.

BACKGROUND OF THE INVENTION

1. Field of the Invention

The present invention relates generally to a heat sink, and more particularly to a knockdown heat sink structure, in which the heat transfer area for the high-temperature section of a carrier body is enlarged so as to more quickly dissipate the heat.

2. Description of the Related Art

In general, a heat sink is a heat dissipation component in contact with the surface of a heat generation component for transferring the heat of the heat generation component and dissipating the heat. The heat sink mainly has multiple radiating fins in contact with the ambient air for enlarging the heat dissipation area of the heat sink. The heat of the heat generation component is conducted to the radiating fins. The radiating fins then heat-exchange with the air and dissipate the heat to outer side by way of radiation so as to lower the temperature of the heat generation component.

The conventional heat sinks can be classified into the sink with aluminum-extruded radiating fins, the heat sink with fastened radiating fins, the heat sink with heat pipe-type radiating fins and the heat sink with stacked radiating fins of upper and lower layers. No matter which type the heat sink is made with and what material the heat sink is made of, when the heat sink is in contact with a heat source (such as a central processing unit or a graphics processing chip), a part of the bottom face of the heat sink is in direct contact with the surface of the heat source. For example, when a 10 cm×10 cm heat sink is in contact with a 3 cm×3 cm heat source, only a 3 cm×3 cm contact section of the heat sink is in contact with the surface of the heat source, while the rest of the heat sink is distal from the heat source without contacting the heat source. Therefore, the heat of the heat source is mainly transferred to the radiating fins through the 3 cm×3 cm contact section of the heat sink and then dissipated to outer side. As a result, the temperature of the contact section is higher than the other section of the heat sink so that the contact section becomes a high-temperature section. The longer the heat dissipation distance is, the less the heat transfer amount is. Therefore, the other section of the heat sink that is not in contact with the heat source or is distal from the heat source becomes a non-high-temperature section. Accordingly, only the 3 cm×3 cm contact section of the heat sink is in contact with the heat source so that the heat transfer area of the heat sink is insufficient and only a small fraction of the bearable heat value is transmitted. As a result, the heat dissipation effect is poor. When the heat source operates, the heat source will quickly generate a mass of heat. The mass of heat cannot be transferred to outer side in time and will continuously accumulate on the high-temperature section. This will lead to overheating problem of the high-temperature section.

It is therefore tried by the applicant to provide a knockdown heat sink structure to solve the problem of the conventional heat sink that the heat transfer area of the high-temperature section is insufficient and the heat will continuously accumulate on the high-temperature section to overheat the high-temperature section. The knockdown heat sink structure of the present invention can provide a larger heat transfer area for the high-temperature section so as to more quickly dissipate the heat.

SUMMARY OF THE INVENTION

It is therefore a primary object of the present invention to provide a knockdown heat sink structure, in which the space above the high-temperature section of the heat sink provides larger heat dissipation area for the high-temperature section so as to more quickly dissipate the heat. Accordingly, the knockdown heat sink structure of the present invention can solve the problem of the conventional heat sink that the heat will accumulate on the high-temperature section to overheat the high-temperature section.

To achieve the above and other objects, the knockdown heat sink structure of the present invention includes a carrier body having at least one high-temperature section in contact with at least one heat source. A section of the carrier body, which is not in contact the heat source or distal from the heat source is defined as a non-high-temperature section. A first radiating fin assembly with a height is disposed on the non-high-temperature section. A second radiating fin assembly higher than the height of the first radiating fin assembly is disposed on the high-temperature section. The second radiating fin assembly includes multiple second radiating fins. Each second radiating fin has a first part. The first part has a bottom end and a top end. The bottom end is connected with or integrally formed on the high-temperature section of the carrier body. The top end is higher than the height of the first radiating fin assembly. A second part outward spreads and extends from the top end of the first part. The second part covers the first radiating fin assembly without contacting the same, whereby a spacing flow way is defined between the first radiating fin assembly and the second part of the second radiating fin assembly. The top end of the first part of the second radiating fin is higher than the height of the first radiating fin assembly. The second part outward spreads and extends from the top end of the first part, whereby the space above the high-temperature section of the carrier body provides larger heat dissipation area for the high-temperature section.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
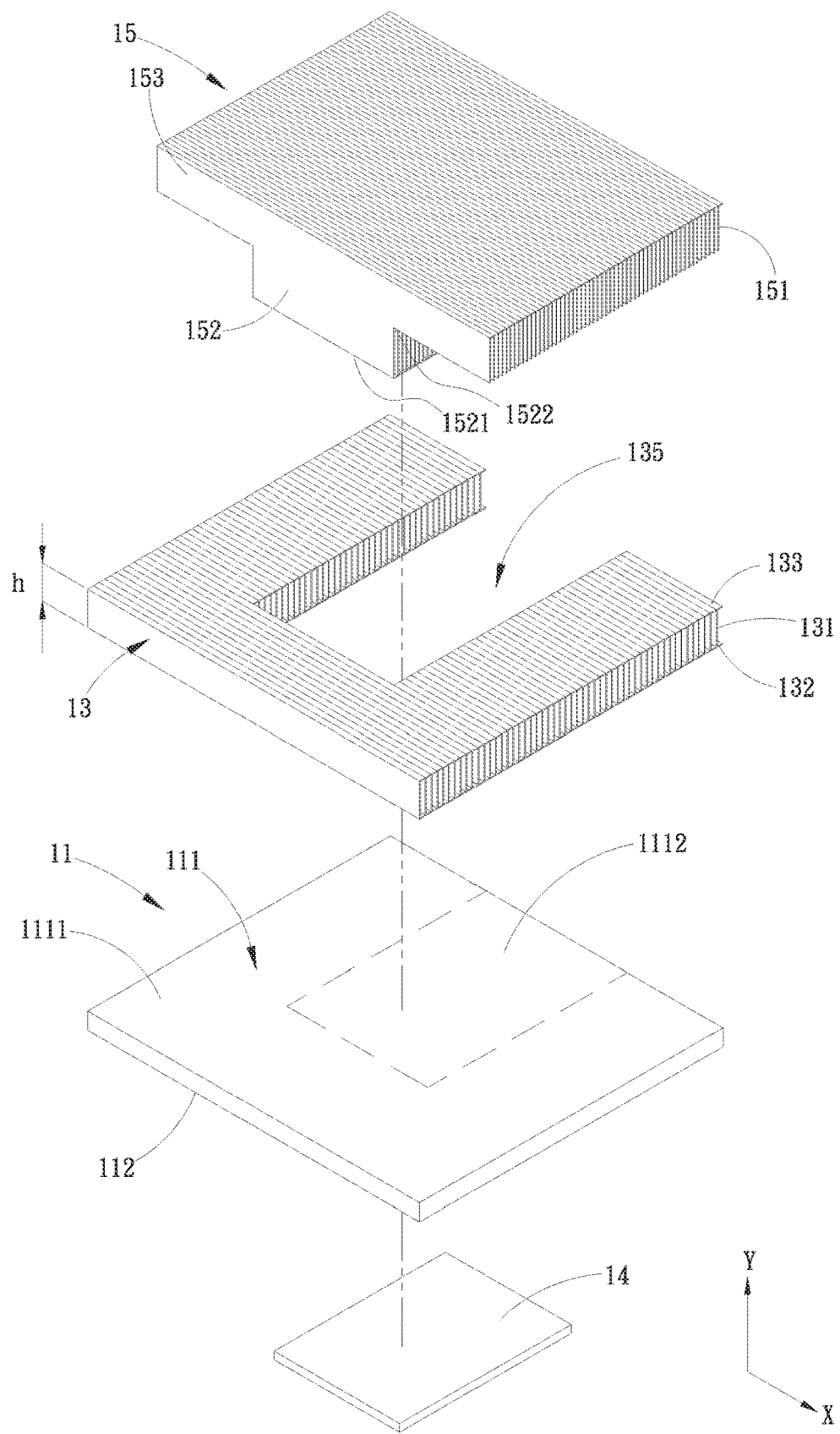
FIG. 1 is a perspective exploded view of the present invention.
Figure 2:
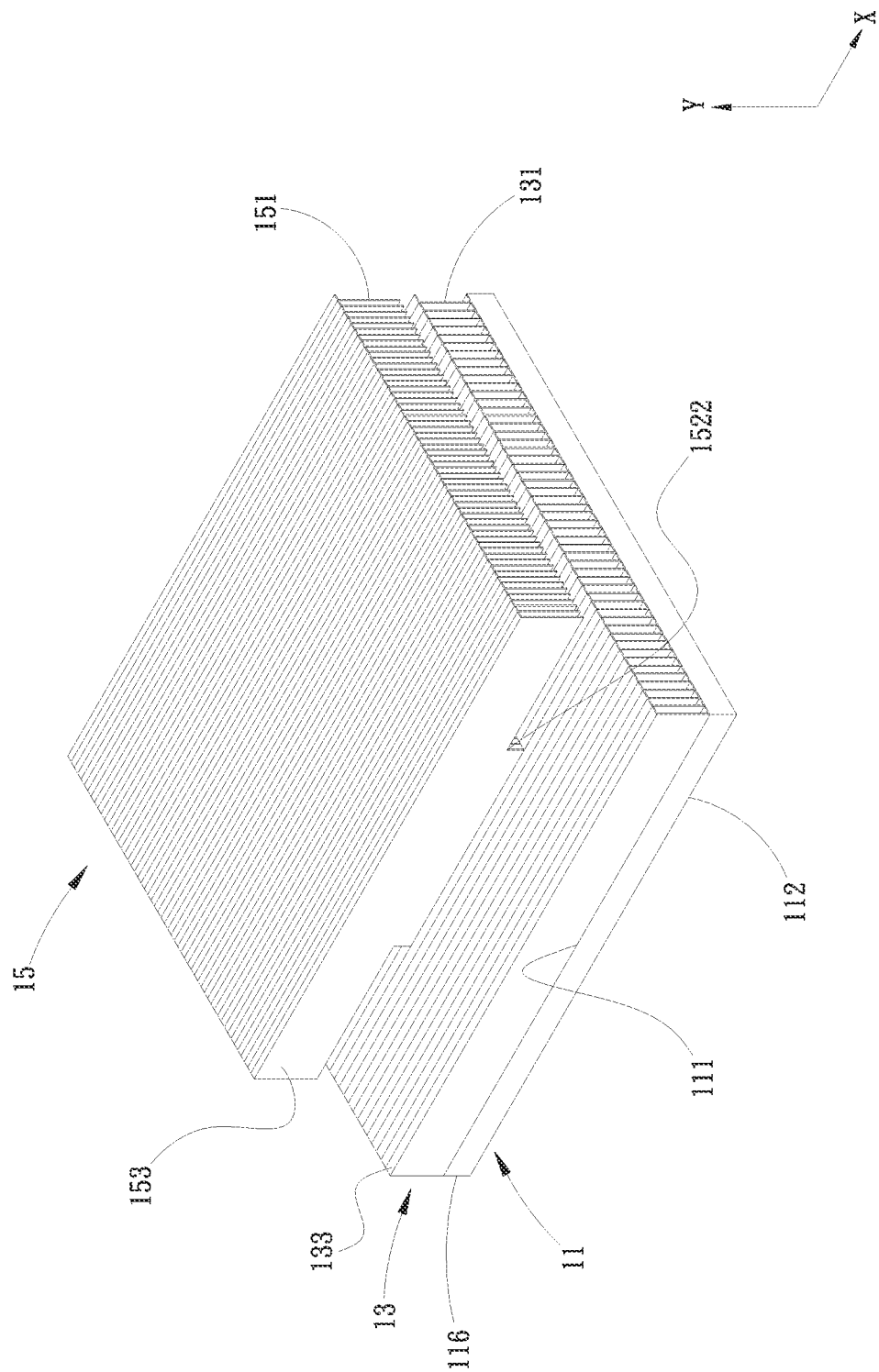
FIG. 2 is a perspective assembled view of the present invention.
Figure 3:
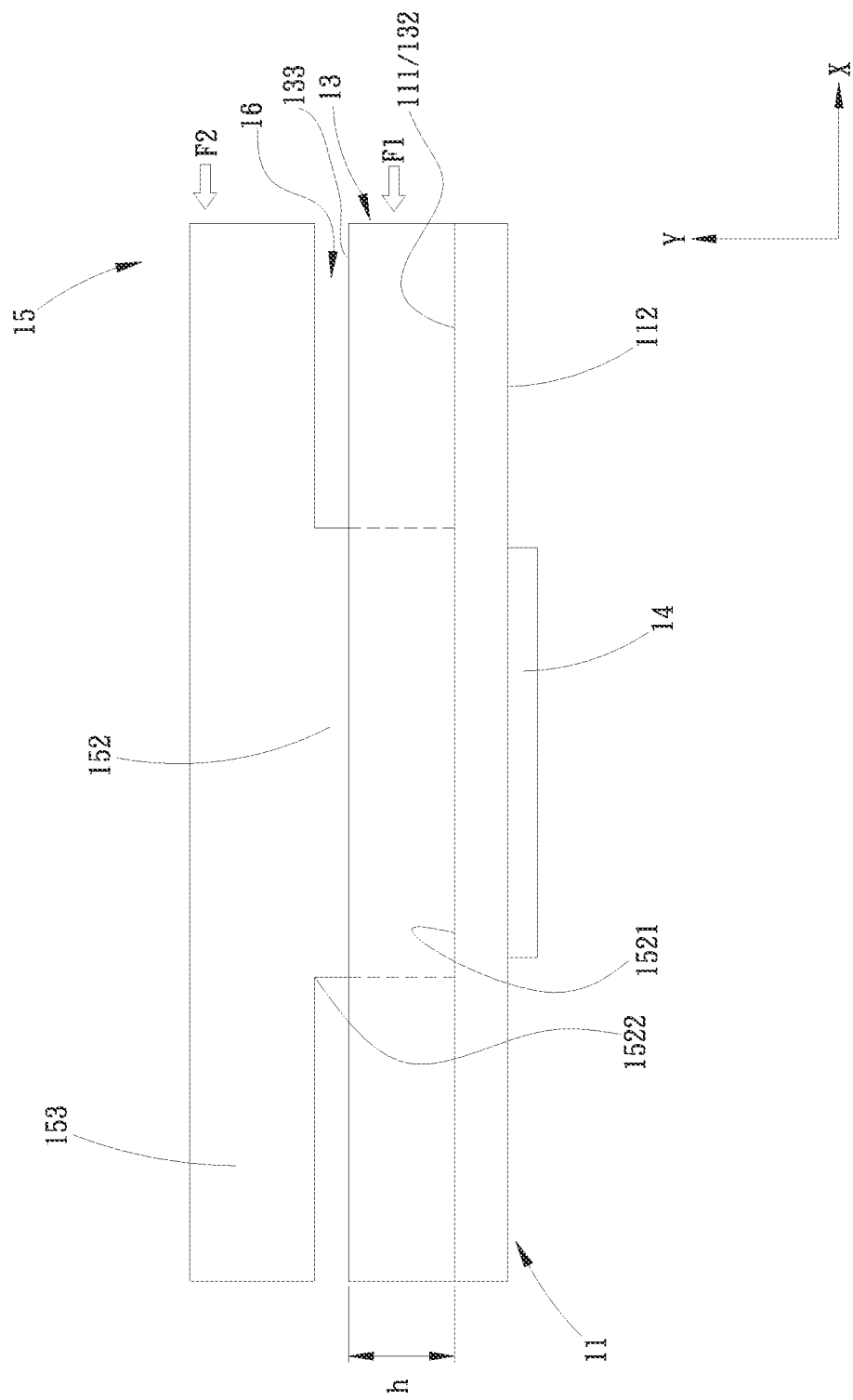
FIG. 3 is a front assembled view of the present invention.

Please refer to FIGS. 1, 2 and 3. FIG. 1 is a perspective exploded view of the present invention. FIG. 2 is a perspective assembled view of the present invention. FIG. 3 is a front assembled view of the present invention. The knockdown heat sink structure of the present invention includes a carrier body 11. The carrier body 11 is a heat conduction plate body such as a flat-plate heat pipe, a vapor chamber, a copper plate, a copper alloy plate, a titanium plate, a titanium alloy plate or a metal complex laminate. A part of a surface of the carrier body 11 is in direct contact with at least one heat source 14 to form a high-temperature section 1112. A section around the high-temperature section 1112 without contacting the heat source 14 or distal from the heat source 14 is defined as a non-high-temperature section 1111. The non-high-temperature section 1111 is adjacent to the high-temperature section 1112. The high-temperature section 1112 is in contact with the heat source 14, while the non-high-temperature section 1111 is distal from the heat source 14 or is not in contact with the heat source 14 so that the temperature of the high-temperature section 1112 is higher than the temperature of the non-high-temperature section 1111. A first radiating fin assembly 13 with a height h is disposed on the non-high-temperature section 1111 and a second radiating fin assembly 15 higher than the height h of the first radiating fin assembly 13 is disposed on the high-temperature section 1112.

The first radiating fin assembly 13 serves to transfer the heat of the non-high-temperature section 1111 to heat-exchange with outer side. The first radiating fin assembly 13 is composed of multiple first radiating fins 131 arranged at intervals. Each first radiating fin 131 of the first radiating fin assembly 13 has a lower end 132 and an upper end 133. The lower end 132 is connected with or integrally formed on the non-high-temperature section 1111 of the carrier body 11. The upper end 133 is positioned on upper side of the radiating fin. The height h of the first radiating fin assembly 13 is defined between the lower end 132 and the upper end 133.

The second radiating fin assembly 15 is disposed on the high-temperature section 1112 and composed of multiple second radiating fins 151 arranged at intervals. Each second radiating fin 151 of the second radiating fin assembly 15 has a first part 152. The first part 152 has a bottom end 1521 and a top end 1522. The bottom end 1521 of the first part 152 is connected with or integrally formed on the high-temperature section 1112 of the carrier body 11. The top end 1522 of the first part 152 is higher than the height h of the first radiating fin assembly 13. A second part 153 outward (horizontally or obliquely) spreads and extends from the top end 1522 of the first part 152. The second part 153 is positioned above the first radiating fin assembly 13 to cover the first radiating fin assembly 13 without contacting the same. Accordingly, a spacing flow way 16 is defined between the first radiating fin assembly 13 and the second part 153 of the second radiating fin assembly 15.

In this embodiment, the second part 153 at least spreads and extends in a horizontal direction X. Two sides of the second part 153 respectively extend in the horizontal direction X to two opposite sides, (that is, the left side and the right side of the carrier body 11 as shown in the drawing).

Accordingly, the first part 152 and the second part 153 together form a T-shaped body standing on the high-temperature section 1112 of the carrier body 11.

In this embodiment, the second part 153 outward spreads and extends from the top end 1522 of the first part 152. The top end 1522 of the first part 152 is higher than the height h of the first radiating fin assembly 13, whereby the space above the high-temperature section 1112 provides larger heat dissipation area for the high-temperature section 1112 so as to increase the heat dissipation amount of the high-temperature section 1112 and enhance the heat dissipation rate thereof.

Please further refer to FIG. 1. The first radiating fin assembly 13 is formed with a void section 135 avoiding the high-temperature section 1112, whereby the second radiating fin assembly 15 is disposed in the void section 135 on the high-temperature section 1112. Therefore, the first radiating fin assembly 13 and the second radiating fin assembly 15 are compactly arranged to form the knockdown heat sink structure without invalid space.

Furthermore, at least one first airflow F1 and at least one second airflow F2 respectively flow through the first radiating fin assembly 13 and the second radiating fin assembly 15 to help in dissipating the heat of the first radiating fin assembly 13 and the second radiating fin assembly 15. In addition, the second airflow F2 partially flows through the spacing flow way 16 to carry away the heat of the first radiating fin assembly 13.

The first radiating fin assembly 13 and the second radiating fin assembly 15 and the carrier body 11 can be an integrally formed body or respective independent components connected with each other by a connection means. For example, in this embodiment, as shown in the drawings, the first radiating fins 131 of the first radiating fin assembly 13 and the second radiating fins 151 of the second radiating fin assembly 15 are fastened with each other and then respectively connected with the non-high-temperature section 1111 and the high-temperature section 1112 of the carrier body 11 by a connection means (such as welding or adhesion). In a modified embodiment, the first radiating fins 131 of the first radiating fin assembly 13 and the second radiating fins 151 of the second radiating fin assembly 15 are not fastened with each other. Instead, the first radiating fins 131 and the second radiating fins 151 are respectively connected with the non-high-temperature section 1111 and the high-temperature section 1112 by a connection means (such as welding or adhesion or insertion). Alternatively, the first radiating fin assembly 13 and the second radiating fin assembly 15 are integrally formed with the carrier body 11 (by means of such as injection molding or 3D printing). For example, the first radiating fins 131 and the second radiating fins 151 respectively upward protrude from the non-high-temperature section 1111 and the high-temperature section 1112 of the carrier body 11.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A knockdown heat sink structure comprising
    a carrier plate having at least one high-temperature section in contact with at least one heat source, a section of the carrier plate, which is not in contact the heat source or distal from the heat source being defined as a non-high-temperature section,
    a first radiating fin assembly with a height disposed directly on the non-high-temperature section,
    a second radiating fin assembly higher than the height of the first radiating fin assembly disposed directly on the high-temperature section, the second radiating fin assembly including multiple second radiating fins, each second radiating fin having a first part, the first part having a bottom end and a top end, the bottom end connected directly with or integrally formed on the high-temperature section of the carrier plate, the top end of the first part of the second radiating fin assembly being higher than the height of the first radiating fin assembly, a second part outward spreading and extending from the top end of the first part, the second part covering the first radiating fin assembly without contacting the same, whereby a spacing flow way is defined between the first radiating fin assembly and the second part of the second radiating fin assembly, a top end of the second part of the second radiating fin being higher than the height of the first radiating fin assembly, whereby the space above the high-temperature section of the carrier plate provides larger heat dissipation area for the high-temperature section.

2. The knockdown heat sink structure as claimed in claim 1, wherein the first radiating fin assembly includes multiple first radiating fins, each first radiating fin having a lower end and an upper end, the lower end connected on the non-high-temperature section of the carrier plate by a connection means, the upper end positioned on an upper side of the first radiating fin, the height of the first radiating fin assembly defined between the lower end and the upper end.

3. The knockdown heat sink structure as claimed in claim 1, wherein the second part of each second radiating fin of the second radiating fin assembly horizontally or obliquely outward spreads and extends from the top end of the first part.

4. The knockdown heat sink structure as claimed in claim 1, wherein the first radiating fin assembly is formed with a void section avoiding the at least one high-temperature section, the second radiating fin assembly positioned in the void section.

* * * * *